(12) United States Patent
He et al.

(10) Patent No.: US 11,575,245 B2
(45) Date of Patent: Feb. 7, 2023

(54) THIN-FILM FILTER FOR TUNABLE LASER

(71) Applicant: Marvell Asia Pte. Ltd., Singapore (SG)

(72) Inventors: Xiaoguang He, Diamond Bar, CA (US); Radhakrishnan L. Nagarajan, Santa Clara, CA (US); Brian Taylor, Santa Clara, CA (US)

(73) Assignee: Marvell Asia Pte Ltd., Singapore (SG)

( * ) Notice: Subject to any disclaimer, the term of this patent is extended or adjusted under 35 U.S.C. 154(b) by 270 days.

(21) Appl. No.: 16/805,526

(22) Filed: Feb. 28, 2020

(65) Prior Publication Data
US 2021/0273408 A1 Sep. 2, 2021

(51) Int. Cl.
| | |
|---|---|
| *G02F 1/01* | (2006.01) |
| *H01S 5/10* | (2021.01) |
| *H01S 5/323* | (2006.01) |
| *H01S 5/028* | (2006.01) |
| *H01S 5/0234* | (2021.01) |

(52) U.S. Cl.
CPC ............ *H01S 5/1021* (2013.01); *G02F 1/011* (2013.01); *H01S 5/028* (2013.01); *H01S 5/0234* (2021.01); *H01S 5/32391* (2013.01); *G02F 2203/50* (2013.01)

(58) Field of Classification Search
CPC ...................................................... G02F 1/011
USPC ............................................................. 385/3
See application file for complete search history.

(56) References Cited

U.S. PATENT DOCUMENTS

| | | | |
|---|---|---|---|
| 7,043,097 B2* | 5/2006 | Coldren | G02F 1/0356 385/15 |
| 2006/0268241 A1* | 11/2006 | Watson | G03B 21/204 348/E9.027 |
| 2006/0280219 A1* | 12/2006 | Shchegrov | G03B 21/204 372/99 |
| 2007/0153866 A1* | 7/2007 | Shchegrov | H04N 9/315 372/99 |
| 2015/0288142 A1* | 10/2015 | Fu | G02F 1/1337 372/20 |
| 2020/0280173 A1* | 9/2020 | Gao | H01S 5/02415 |
| 2020/0412093 A1* | 12/2020 | Kischkat | H01S 5/3401 |

\* cited by examiner

*Primary Examiner* — Kaveh C Kianni

(57) ABSTRACT

A thin-film device for a wavelength-tunable semiconductor laser. The device includes a cavity between a high-reflectivity facet and an anti-reflection facet designed to emit a laser light of a wavelength in a tunable range determined by two Vernier-ring resonators with a joint-free-spectral-range between a first wavelength and a second wavelength. The device further includes a film including multiple pairs of a first layer and a second layer sequentially stacking to an outer side of the high-reflectivity facet. Each layer in each pair has one unit of respective optical thickness except one first or second layer in one pair having a larger optical thickness. The film is configured to produce inner reflectivity of the laser light from the high-reflectivity facet at least >90% for wavelengths in the tunable range starting from the first wavelength but at least <50% for wavelengths in a 25 nm range around the second wavelength.

14 Claims, 9 Drawing Sheets

THIN-FILM FILTER FOR TUNABLE LASER

BACKGROUND OF THE INVENTION

The present invention relates to optical telecommunication techniques. More particularly, the present invention provides a thin-film filter for a wavelength tunable laser gain chip based on silicon photonics, a tunable filter having the same, and a silicon photonics system having the same.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

40-Gbit/s and then 100-Gbit/s data rates wide-band DWDM (Dense Wavelength Division Multiplexed) optical transmission over existing single-mode fiber is a target for the next generation of fiber-optic communication networks. Chip-scale wide-band wavelength-tunable lasers have been of interest for many applications such as wide-band DWDM communication and wavelength-steered light detection and ranging (LIDAR) sensing. More recently, optical components are being integrated on silicon (Si) substrates for fabricating large-scale photonic integrated circuits that co-exist with micro-electronic chips. a whole range of photonic components, including filters, (de)multiplexers, splitters, modulators, and photodetectors, have been demonstrated, mostly in the silicon-on-insulator (SOI) platform. The SOI platform is especially suited for standard DWDM communication bands at 1300 nm and 1550 nm, as silicon (n=3.48) and its oxide $SiO_2$ (n=1.44) are both transparent, and form high-index contrast, high-confinement waveguides ideally suited for medium to high-integration silicon photonics integrated circuits (SPICs).

Wavelength tunable semiconductor lasers in silicon photonics platform have been implemented as fundamental elements for many optical fiber communications applications including coherent optical transmission with increasing spectral efficiency. A variety of spectrally efficient modulation formats such as M-ary phase shift keying (PSK) and quadrature amplitude modulation (QAM) without relying upon a rather complicated optical phase-locked loop. In addition, since the phase information is preserved after detection, we can realize electrical post-processing functions such as compensation for chromatic dispersion and polarization-mode dispersion in the digital domain. However, technical challenges exist, such as making the Vernier ring in small size in silicon photonics substrate for enlarging the free-spectral-range with sufficient side-mode suppression ratio, for making polarization-independent wavelength-tunable lasers as well as integrating them to form a coherent system in a compact silicon photonics platform. Therefore, improved techniques and methods are desired.

BRIEF SUMMARY OF THE INVENTION

The present invention relates to optical telecommunication techniques. More particularly, the present invention provides a thin-film filter applied to a high-reflection facet of a tunable laser gain chip based on silicon photonics, a tunable filter having the same applied in silicon photonics integrated circuits, though other applications are possible.

In an embodiment, the present invention provides a thin-film device for a wavelength-tunable semiconductor laser. The thin-film device includes a cavity between a high-reflectivity facet and an anti-reflection facet designed to emit a laser light of a wavelength in a tunable range determined by at least two Vernier-ring resonators with a joint-free-spectral-range between a first wavelength and a second wavelength. The thin-film device further includes a film including multiple pairs of layers each containing a first layer and a second layer sequentially stacking to an outer side of the high-reflectivity facet. Each of the first layer and the second layer in each pair has one unit of respective optical thickness except one first or second layer in one pair having a larger optical thickness. The film is configured to produce inner reflectivity of the laser light from the high-reflectivity facet at least greater than 90% for wavelengths in the tunable range starting from the first wavelength but at least smaller than 50% for wavelengths in a 25 nm range around the second wavelength.

In an alternative embodiment, the present invention provides a gain chip of a wavelength tunable semiconductor laser. The gain chip includes a lasing cavity having an active region between a high-reflectivity facet and an anti-reflection facet. The lasing cavity is designed to emit a laser light of a wavelength in a tunable range determined by at least two Vernier-ring resonators with a joint-free-spectral-range between a first wavelength and a second wavelength. The gain chip further includes a film including multiple pairs of layers each containing a first layer and a second layer sequentially stacking to an outer side of the high-reflectivity facet. Each of the first layer and the second layer in each pair has one unit of respective optical thickness except one first or second layer in one pair having a larger optical thickness. The film is configured to produce inner reflectivity of the laser light from the high-reflectivity facet at least greater than 90% for wavelengths in the tunable range starting from the first wavelength but at least smaller than 50% for wavelengths in a 25 nm range around the second wavelength.

In yet another alternative embodiment, the present invention provides a wavelength tunable semiconductor laser. The wavelength tunable semiconductor laser includes a Vernier tuner having at least two ring resonators formed in a silicon photonics substrate. The at least two ring resonators are configured to yield a joint free-spectral-range between a first wavelength and a second wavelength. The wavelength tunable semiconductor laser further includes a phase matcher having a waveguide formed in the silicon photonics substrate and coupled to the at least two ring resonators. Additionally, the wavelength tunable semiconductor laser includes a gain chip comprising a lasing cavity having an active region between a high-reflectivity facet and an anti-reflection facet with an exit port. The gain chip is flip-bonded to the silicon photonics substrate to have the exit port coupled to the waveguide of the phase matcher. The lasing cavity is designed to emit a laser light out of the exit port with a wavelength in a tunable range starting from the first wavelength to a mid-point of the joint-free-spectral-range. Furthermore, the wavelength tunable semiconductor laser includes a film made from multiple pairs of layers each containing a first layer and a second layer sequentially stacking to an outer side of the high-reflectivity facet. Each of the first layer and the second layer in each pair has one unit of respective optical thickness corresponding to a quarter of a reference wavelength except one first or second layer in one pair having a larger optical thickness. The film is configured to produce inner reflectivity of the laser light from the high-reflectivity facet at least greater than 90% for wavelengths in the tunable range but at least smaller than 50% for wavelengths in a 25 nm range around the second wavelength.

The present invention achieves these benefits and others in the context of known technology of wavelength-tunable laser with a Vernier reflection tuner. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates to optical telecommunication techniques. More particularly, the present invention provides a thin-film filter applied to a high-reflection facet of a tunable laser gain chip based on silicon photonics, a tunable filter having the same applied in silicon photonics integrated circuits, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels inner, outer, left, right, front, back, top, bottom, end, forward, reverse, clockwise and counter clockwise have been used for convenience purposes only and are not intended to imply any particular fixed direction. Instead, they are used to reflect relative locations and/or directions between various portions of an object.

Figure 1:
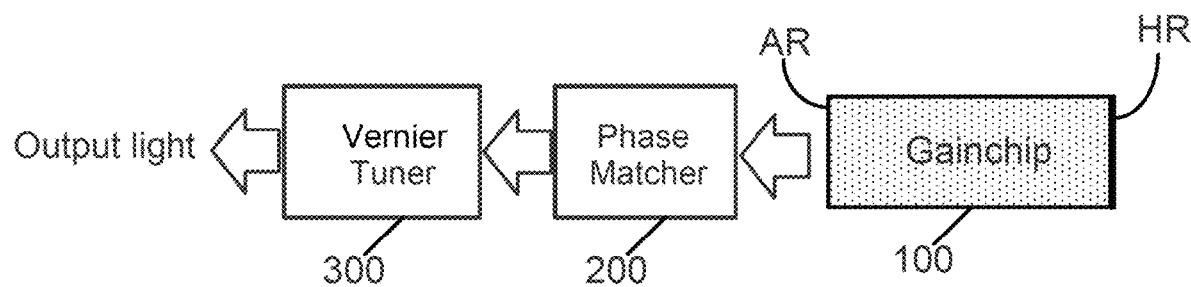
FIG. 1 is a schematic diagram of a functional tunable laser with a Vernier reflection tuner and a phase shifter according to an embodiment of the present invention.

In an aspect, the present disclosure provides a thin-film device disposed in a lasing cavity of a wavelength tunable semiconductor laser based on silicon photonics platform for supporting mode selection/suppression and stability. The tunable laser is typically provided, as shown in FIG. 1, with a gain chip 100 coupled via a phase matcher 200 to one or more Vernier ring resonators 300. The gain chip 100 includes an active region configured in a PN junction diode in linear waveguide in a lasing cavity between an anti-reflection (FR) facet and a high-reflectivity (HR) facet. The lasing cavity is designed to induce a laser excitation emitted from the active region and resonated between the AR facet and the HR facet. The Vernier tuner 300 is a ring-shaped waveguide structure formed in a silicon photonics substrate that provides an extended cavity to generate a certain free-spectral-range (FSR) in an interference spectrum and provides tunability for the wavelength of a laser light emitted from the gain chip 100 based on the lasing cavity. The phase matcher 200 is a linear-shape waveguide formed in the silicon photonics substrate with thermal phase control for further providing a finer tunability to determine a final wavelength for the laser light emitted out of the lasing cavity.

Figure 2:
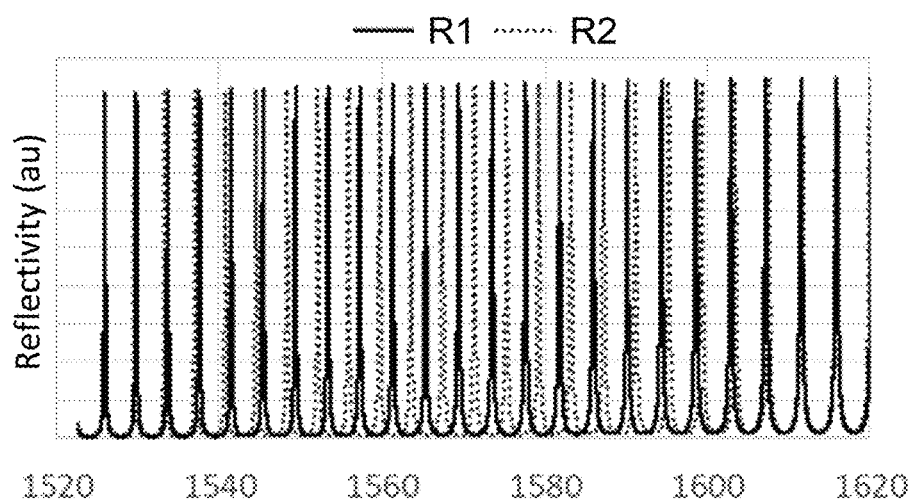
FIG. 2 is an exemplary plot of individual and joint reflection spectrum from two Vernier rings of the tunable laser according to an embodiment of the present invention.
Figure 2:
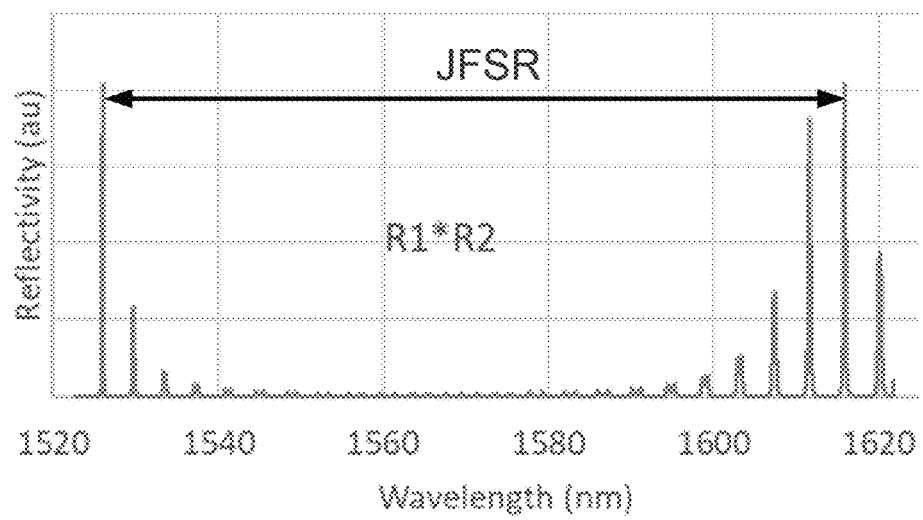

In an embodiment, the Vernier tuner 300 includes at least two ring resonators, R1 and R2, formed in the silicon photonics substrate (not explicitly shown in FIG. 1). Each ring resonator, R1 or R2, provides a reflection spectrum in the extended cavity, as shown in upper part of FIG. 2 over a wide wavelength range from 1520 nm to 1620 nm. The particular positions of multiple constructive interference peaks of each reflection spectrum are also contributed by adjusting phase shift of the phase matcher 200. The bottom part of FIG. 2 shows a joint interference spectrum (referred as R1*R2) of the two reflection spectra in the same wavelength range. As seen, the joint spectrum is characterized by a joint-free-spectral-range (JFSR), which is a wavelength spacing between two major interference peaks. In this example, the JFSR is 85 nm from a first wavelength of 1526 nm at a basic mode JFSR peak to a second wavelength of 1611 nm at a high-order or side-mode JFSR peak. The laser emission wavelength is tunable by adjusting the Vernier tuner 300 and the phase matcher 200. For tuning wavelength of the laser emission in wide-band DWDM applications, it is preferred to have a wide FSR for the tunable laser to achieve better selectivity of the laser wavelength. But to achieve wide FSR for better wavelength tunability requires forming very small diameter for the ring resonator formed in the silicon photonics substrate. Additionally, one more element in the extended cavity is needed to achieve mode selection/suppression and stability. Designing and building ring resonators with super small diameters or adding additional element for improving mode selection on the silicon photonics substrate is technically challenging while economically unfavorable.

Figure 3:
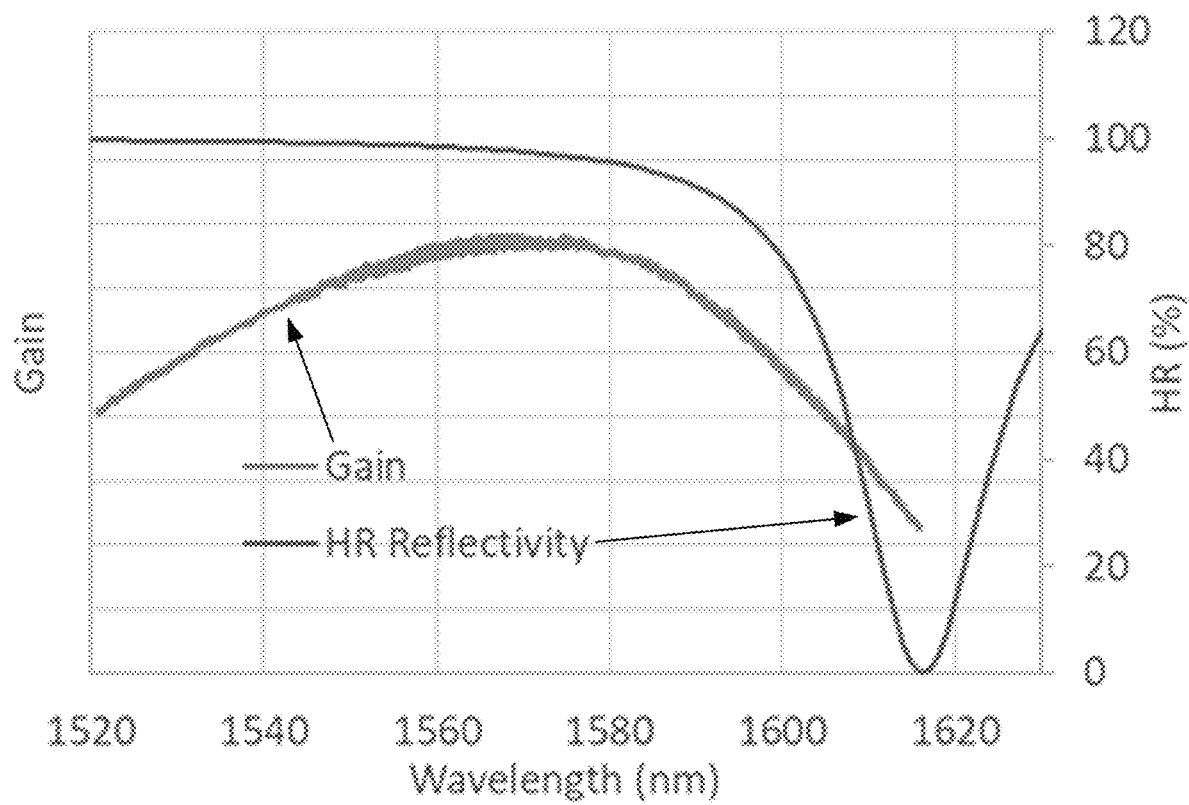
FIG. 3 is an exemplary plot of gain of the tunable laser and reflectivity at a high-reflection (HR) facet of a gain chip thereof desired for suppressing side-mode lasing according to an embodiment of the present invention.

FIG. 3 is an exemplary plot of gain of the tunable laser and reflectivity at a high-reflection facet of a gain chip thereof desired for suppressing side-mode lasing according to an embodiment of the present invention. As shown, the gain curve of the laser emission from the gain chip 100 has a width larger than or at least close to the JFSR under the present Vernier tuner design. Under the Vernier tuner design with two ring resonators, however, the laser cavity can lase at both the basic mode JFSR peak location (e.g., 1526 nm) and the side mode JFSR peak location (e.g., 1611 nm) if the gain chip 100 has flat reflection characteristic at the high-reflectivity (HR) facet. Therefore, it is also preferred to alter the reflection characteristic of the high-reflectivity facet of the gain chip 100 with sufficiently large side-mode suppression ratio (SMSR) so that lasing at the side mode JFSR peak is effectively suppressed. For a tunable laser with a desired tunable range in an extended C-band from 1526 nm to 1568 nm, under the Vernier tuner design with the JFSR=85 nm, one goal is to make HR reflectivity remained to be high (>90%) in the tunable range while dipped at the side mode JFSR peak around 1610-1620 nm with at least 3 dB loss. In the example shown in FIG. 3, the exemplary HR reflectivity is designed to yield a dip or large loss (almost to 0%) around the long wavelength end of the JFSR at 1610 nm while to keep high (>90%) reflectivity in lower portion of the JFSR across a wide wavelength range (from 1580 nm down to 1520 nm) for maintaining wavelength tuning function for the extended C-band.

Figure 4:
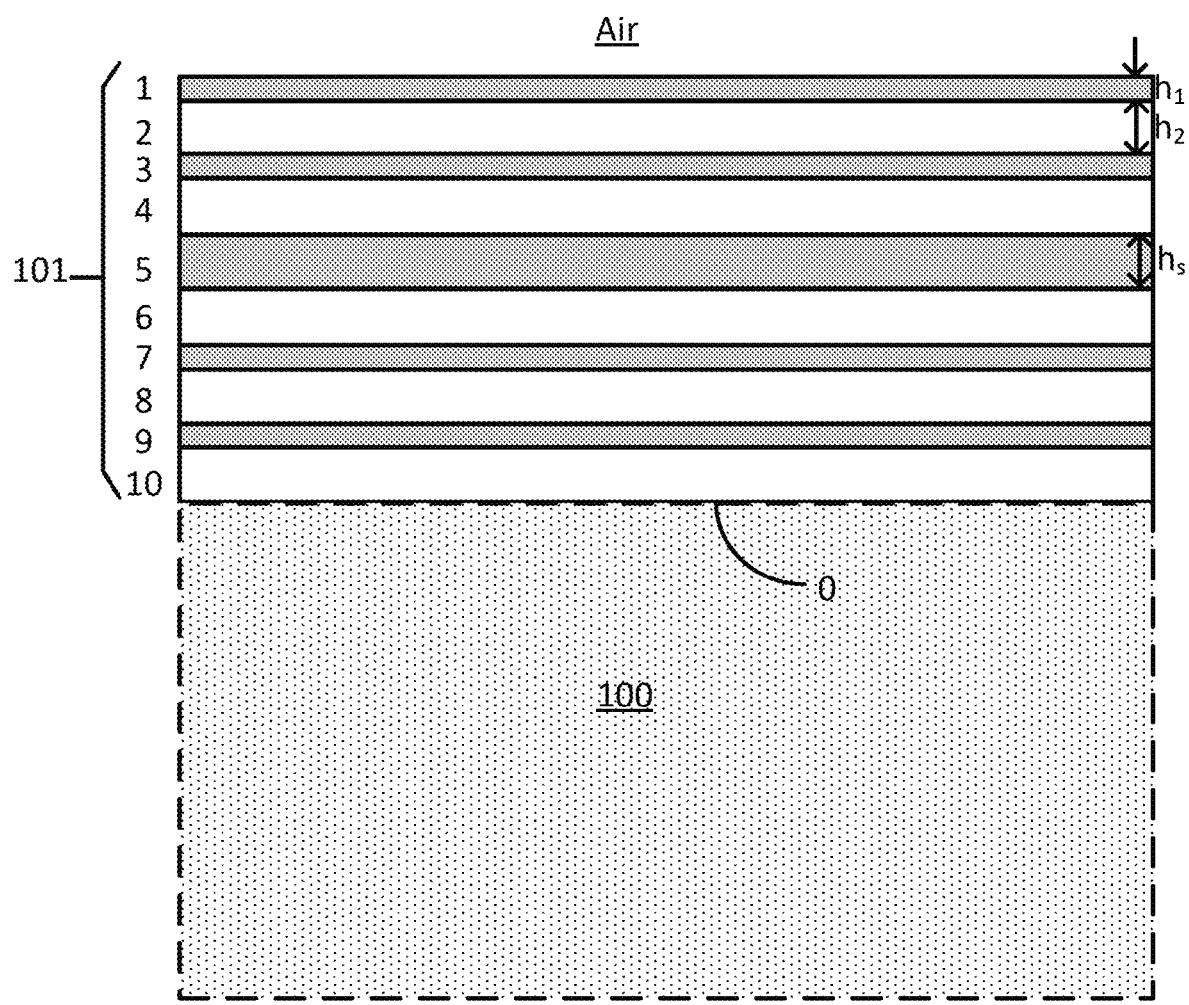
FIG. 4 is a simplified side view of a thin-film filter proposed to achieve the HR reflectivity with a long-wavelength dip of FIG. 3 according to an embodiment of the present invention.

The present disclosure provides a thin-film device attached to the gain chip for altering reflectivity characteristics of the HR facet thereof to create a reflectivity dip in long wavelength side in terms of the JFSR while maintain high reflectivity in lower portion of the JFSR. FIG. 4 is a simplified side view of a thin-film filter proposed to achieve the HR reflectivity with long wavelength dip of FIG. 3 according to an embodiment of the present invention. This diagram is merely an example, which should not unduly limit the scope of the claims. One of ordinary skill in the art would recognize many variations, alternatives, and modifications. As shown, a substrate 100 with a surface 0 is provided. Optionally, the substrate 100 is a part of a gain chip which includes a lasing cavity and the surface 0 serves as a high-reflectivity facet thereof. The thin-film device 101 is attached to an outer side of the surface 0 and configured with a multi-layer structure 101 forming a band-pass filter to provide high inner reflectivity (~100%) flat for a wide range of wavelengths larger than or close to the JFSR. Referring to FIG. 4, the multi-layer structure 101 includes layer 10 through layer 1 sequentially stacking to the outer side of the surface 0 with high reflectivity over a wide range of wavelength while having a reflectivity dip in long-wavelength side.

In an embodiment, the multi-layer structure 101 is configured as multiple pairs of layers stacking together. Each pair of layers of the multi-layer structure 101 includes a first layer of a thickness $h_1$ of a first material with a high refractive index $n_1$ and a second layer of a thickness $h_2$ of a second material with a low refractive index $n_2$, $n_2<n_1$. In the example of FIG. 4, the first pair of layers includes a layer 1 as the first layer and layer 2 as the second layer. A second pair of layers includes a layer 3 as the first layer and layer 4 as the second layer, and so on. Additionally, in an embodiment, each of the first layer and the second layer in each pair of layers is configured to have one unit of respective optical thickness, $n_1 \times h_1 = n_2 \times h_2$, which is set to be a quarter of a reference wavelength. The multi-layer structure 101 of this embodiment provides a thin-film filter having a long-wavelength dip in reflectivity, a desired characteristic of HR reflectivity with long wavelength dip of FIG. 3. Optionally, in another embodiment, all pairs except one pair of layers includes either a first layer or a second layer having a thickness $h_3$ greater than $h_1$ or $h_2$. In the example of FIG. 4, the first layer of the third pair of layers, i.e., layer 5, is the layer with a greater thickness $h_3$. The greater thickness $h_3$ provides an extra phase shift to yield a larger SMSR with the reflectivity dip in a narrowed wavelength range around the side mode JFSR peak comparing to the high reflectivity flat portion over the wide range of the lower portion of the JFSR.

Optionally, the number of the multiple pairs of layers is 5, or 6, or more. In an embodiment, it is preferred to make a total thickness of the multi-layer structure 101 thinner yet to achieve the desired HR reflectivity characteristics. Another factor to be considered for making the multi-layer structure 101 thinner is to choose the reference wavelength to be as small as possible, provided that the one unit of optical thickness for each layer in each pair of layers (except those in the one pair with optional phase shift) to be set as a quarter of the reference wavelength. So, the multi-layer structure 101 can be optimized by coherently tune all following factors including, thickness of each layer, reference wavelength, the number of multiple pairs of layers, selection of materials with different refractive indexes, amount of phase shift added to the one pair of layers with a larger thickness. Preferably, it is desired to have the multi-layer structure 101 shown in FIG. 4 to be optimized with a thin total thickness and optically configured with at least >90% reflectivity over a tunable range of the laser emission designed from a lower end of the JFSR to a mid-point of the JFSR while have at least <50% reflectivity around the higher end of the JFSR.

In some embodiments, the multi-layer structure 101 is formed on the surface 0 by sputtering deposition which provides excellent thickness control for many metal, semiconductor, or oxide materials and yields dense bulklike layers with high quality and stable optical properties. In an example, the first layer with high refractive index is sputtering silicon with $n_1$=3.82 and the second layer with low refractive index is silicon oxide ($SiO_2$) with $n_2$=1.42 or aluminum oxide ($Al_2O_3$) with $n_2$=1.63. In another example, the first layer with high refractive index is sputtering tantalum oxide ($Ta_2O_5$) with $n_1$=2.12 and the second layer with low refractive index is silicon oxide ($SiO_2$) with $n_2$=1.42 or aluminum oxide ($Al_2O_3$) with $n_2$=1.63. The substrate 100 is optionally an indium phosphide material (for forming a gain chip of a cavity laser) with refractive index $n_s$=3.185~3.20. The medium beyond the thin-film filter 101 is air. The reflectivity is referred to inner reflectivity of a laser light reflected from the surface 0 with the thin-film filter 101 back into the substrate 100, e.g., a gain chip based on indium phosphide.

Figure 5:
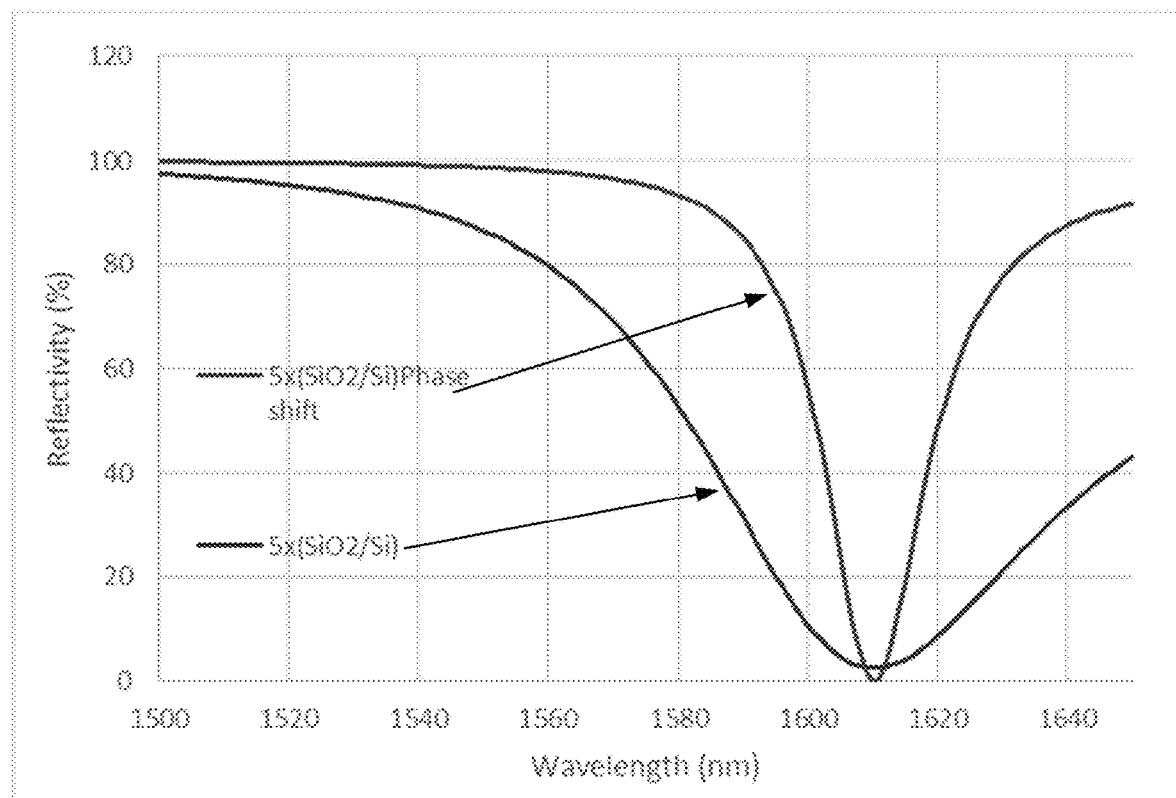
FIG. 5 is a plot of reflectivity over a wide wavelength range for two model filters with and without phase shift according to an embodiment of the present invention.

FIG. 5 is a plot of reflectivity over a wide wavelength range for two model filters with and without phase shift according to an embodiment of the present invention. Referring to FIG. 5, a first model filter is provided with 5 pairs of $SiO_2$/Si layers stacking together on a substrate, each being set to one unit of optical thickness (n×h) equal to a quarter of a reference wavelength without any phase shift. The reflectivity curve yielded from the first model filter is obtained by computer simulation showing that the reflectivity has been pulled down <80% at 1560 nm and gradually dropped to about 5% around 1610 nm before lifted higher. It failed to maintain the reflectivity >90% up to 1568 nm, an upper bound of the extended C-band or the desired tunable range. It also shows relatively poor contrast in the reflectivity drop varying slowly from 1580 nm to 1610 nm.

Referring to FIG. 5 again, a second model filter is provided with 5 pairs of $SiO_2$/Si-phase-shift layers stacking together on the substrate, each being set to one unit of optical thickness (n×h) equal to a quarter of the reference wavelength but with a phase shift in the fifth layer of Si which has a greater thickness than the Si layer in rest pairs of layers. As shown, the reflectivity curve yielded by computer simulation based on the second model filter has >90% high reflectivity from 1520 nm up to 1580 nm before quickly dipped to 0% at 1610 nm, giving much high contract of the reflectivity change from the tunable range of extended C-band to 1610 nm, maintaining high-quality wide-band laser tunable range yet substantially suppressing side mode JFSR lasing.

Figure 6:
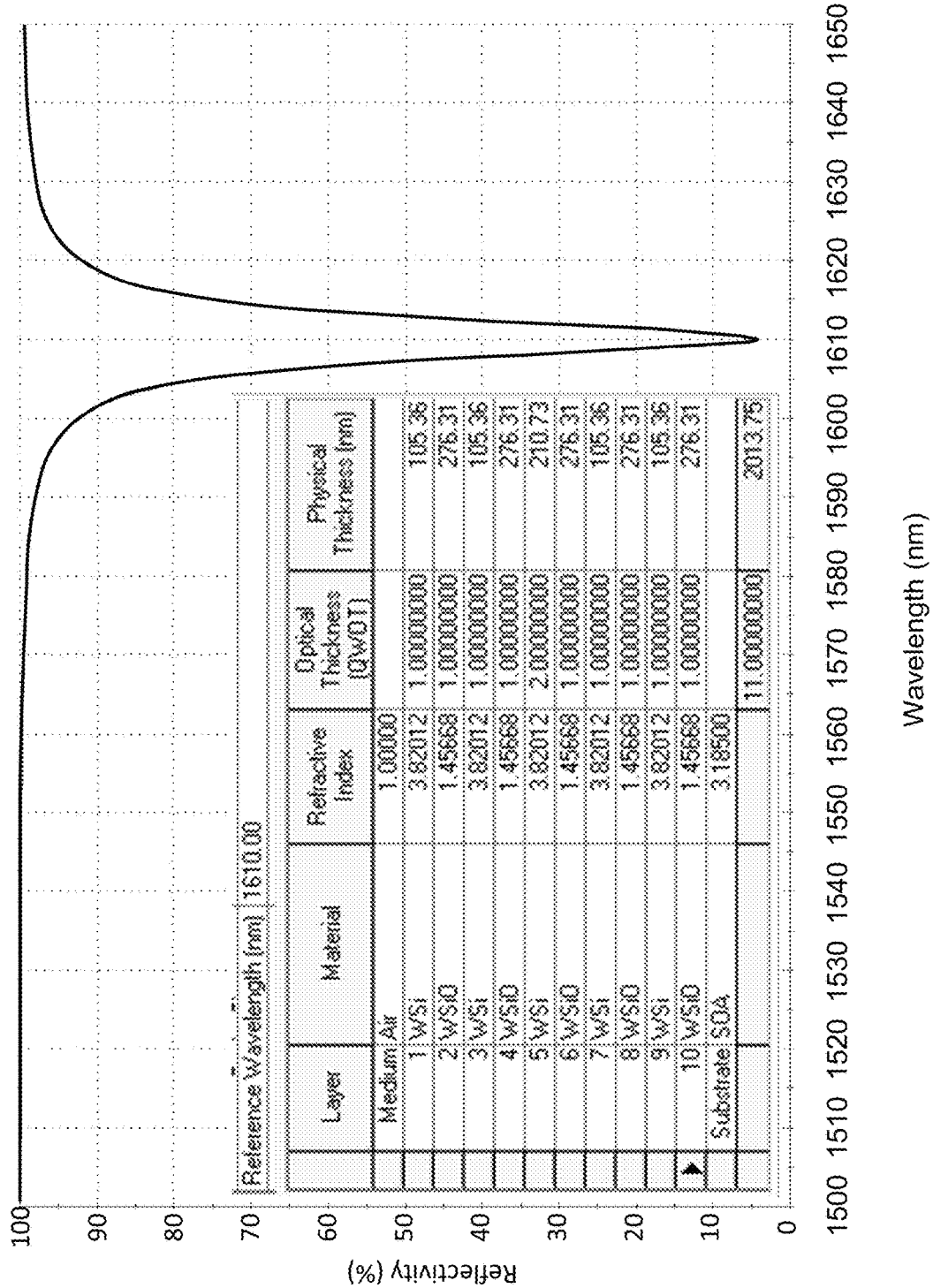
FIG. 6 is a plot of reflectivity from a model filter defined in the inset table according to a specific embodiment of the present invention.

FIG. 6 is a plot of reflectivity from a model filter defined in the inset table according to a specific embodiment of the present invention. Referring to FIG. 6, this is a model filter defined with a 10-layer structure or 5 pairs of $SiO_2$/Si-phase-shift layers shown in the inset table stacking over a HR facet of a tunable laser gain chip. The Si layer, the first layer of each pair, without phase shift is a sputtering deposited silicon with a refractive index of 3.82 and a physical thickness of 105.36 nm, giving its optical thickness of 402.5 nm, which is one unit of optical thickness equal to ¼ of a reference wavelength of 1610 nm. The $SiO_2$ layer, the second layer of each pair, has a refractive index of 1.456 and a physical thickness of 276.31 nm, giving its optical thickness of 402.5 nm, which is also equal to one unit of optical thickness equal to ¼ of the reference wavelength of 1610 nm. The fifth layer, e.g., a Si layer with phase shift, has a physical thickness of 210.73 nm that is twice of the first Si layer, giving the phase shift exact the ¼ of the reference wavelength. Optionally, the layer with phase shift can be one of second layer or in an alternate pair of layers. The thin-film filter based on the 10-layer structure of FIG. 6 results in a desired sharp reflectivity dip to about 5% at 1610 nm and near perfect high reflectivity for wavelengths smaller than 1580 nm down to 1500 nm. It does yield very high SMSR but a total thickness of the 10-layer structure is >2 μm.

Figure 7:
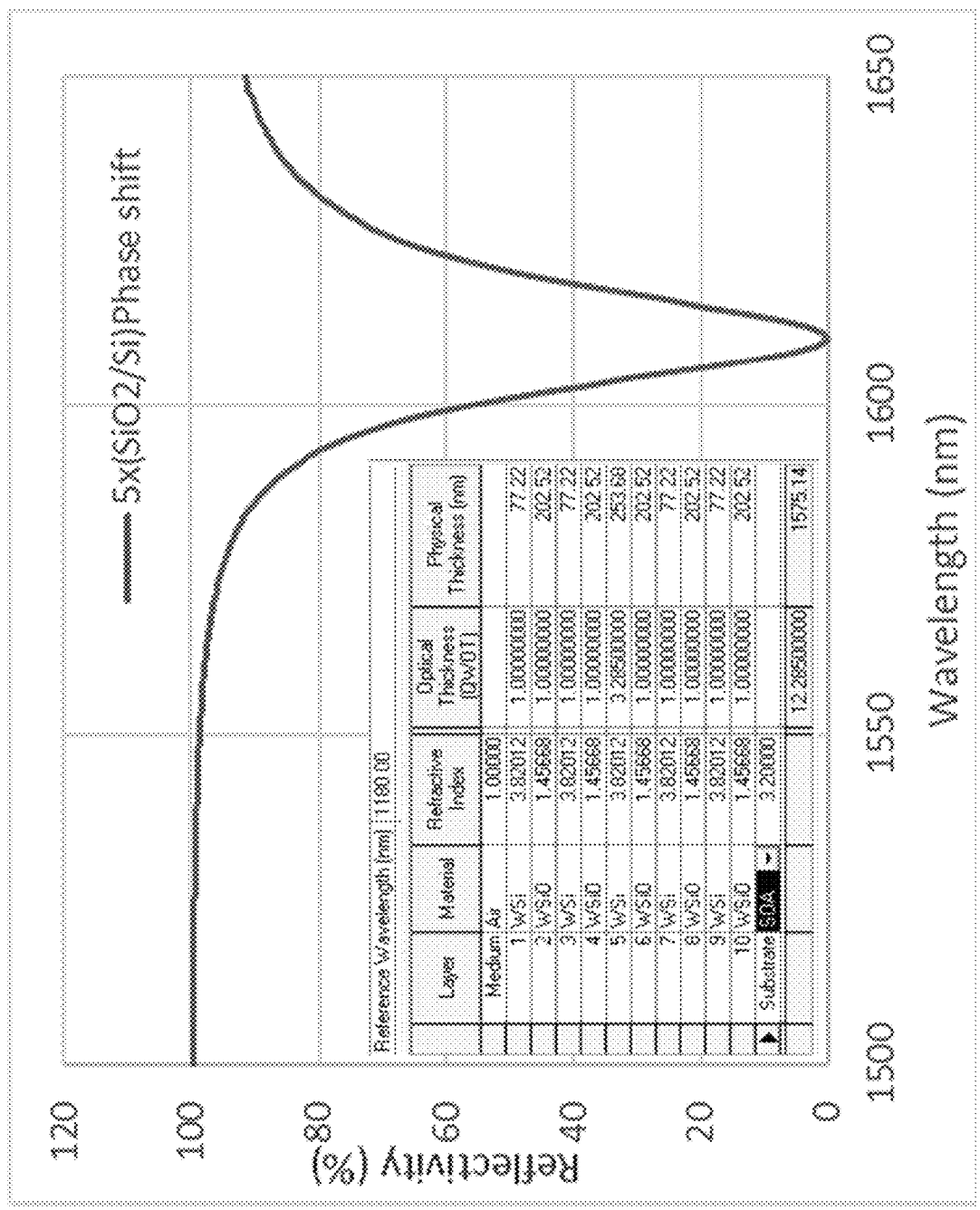
FIG. 7 is a plot of reflectivity from a model filter defined in the inset table according to another specific embodiment of the present invention.

FIG. 7 is a plot of reflectivity from a model filter defined in the inset table according to another specific embodiment of the present invention. Referring to FIG. 7, this is a model filter defined with a 10-layer structure or 5 pairs of $SiO_2$/Si-phase-shift layers shown in the inset table stacking over a HR facet of a tunable laser gain chip. The Si layer, the first layer of each pair, without phase shift is a sputtering deposited silicon with a refractive index of 3.82 and a physical thickness of 77.22 nm, giving its optical thickness of 295 nm, which is one unit of optical thickness equal to ¼ of a reference wavelength of 1180 nm. The reference wavelength for this multi-layer structure is selected to be 1180 nm much smaller than 1610 nm used for the previous module filter of FIG. 6. The $SiO_2$ layer, the second layer of each pair, has a refractive index of 1.456 and a physical thickness of 202.52 nm, giving its optical thickness of 295 nm, which is also equal to one unit of optical thickness equal to ¼ of the reference wavelength of 1180 nm. The fifth layer, e.g., a Si layer with phase shift, has a physical thickness of 253.68 nm that is 3.285 times of the first Si layer, giving the larger phase shift. Optionally, the layer with phase shift can be one of second layer or in an alternate pair of layers. The thin-film filter based on the 10-layer structure of FIG. 7 results in a desired sharp reflectivity perfectly dip to 0% at 1610 nm and high reflectivity >90% for wavelengths smaller than 1580 nm down to 1500 nm. It also yields very high SMSR to be a desired HR filter for the gain chip. Additionally, due to the choice of a smaller reference wavelength of 1180 nm, the total thickness of the 10-layer structure is just lightly over 1.5 μm. A thinner thin-film filter has some advantages in manufacture with less coating time and better mechanical property in terms of stress in the film.

Figure 8:
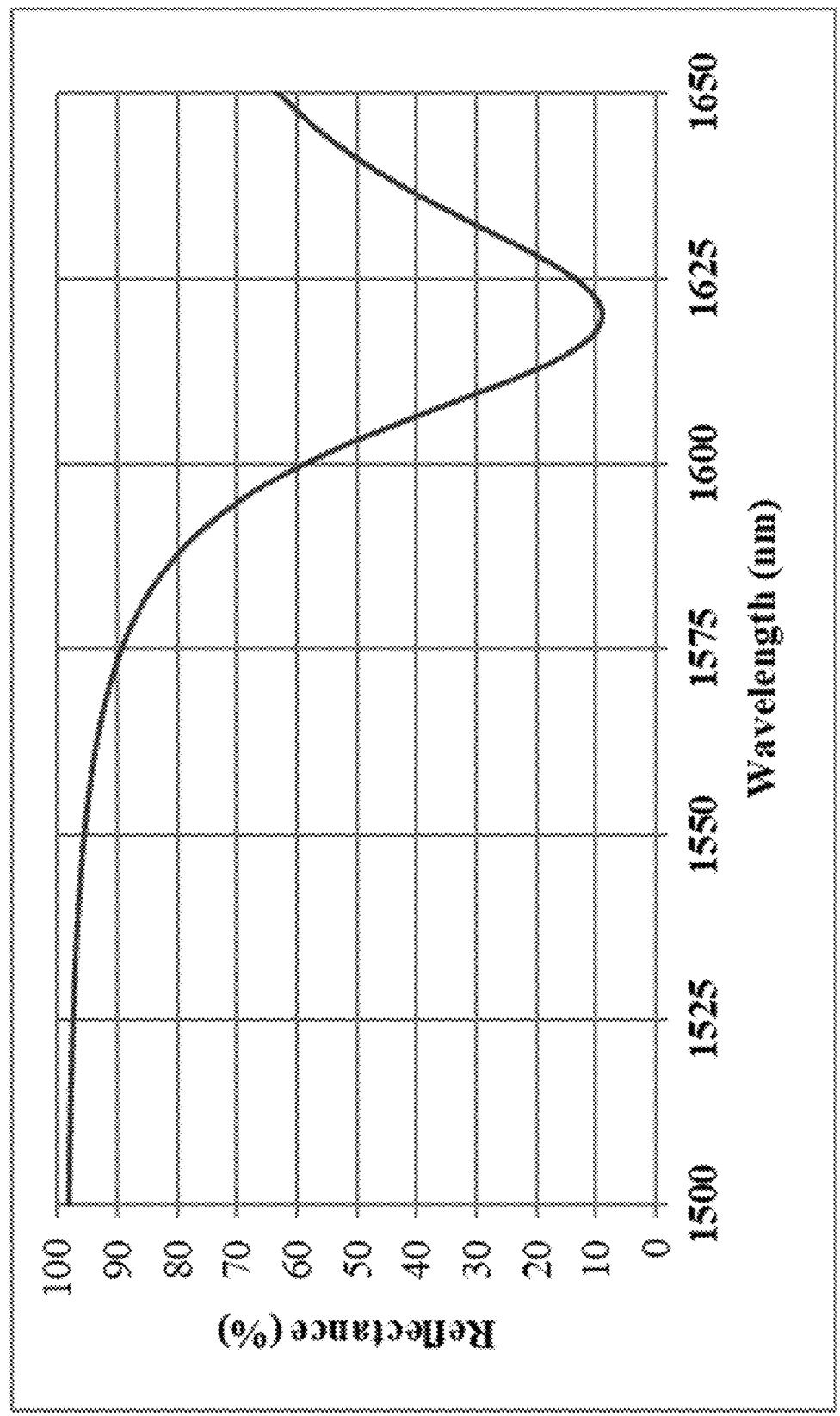
FIG. 8 is a plot of reflectivity from a sample filter based on the model filter proposed in FIG. 7 according to an embodiment of the present invention.

FIG. 8 is a plot of reflectivity from a sample filter based on the model filter proposed in FIG. 7 according to an embodiment of the present invention. Referring to FIG. 8, a sample filter is fabricated based on the model filter proposed in FIG. 7. Considering wavelength-dependent variation and many manufacture process variations in controlling thin-film thickness, mechanical properties, and optical properties of each layer in the 10-layer structure, the reflectivity curve obtained for wavelengths from 1500 nm to 1650 nm is fairly matched with the reflectivity plot for the model filter by computer simulation. As shown, the reflectivity from 1500 nm up to 1565 nm is at least 90% or higher and the reflectively quickly drops for wavelengths over 1580 nm to give a minimum of about 10% at 1617 nm. The reflectivity is at least <30% at the side mode JFSR wavelength of 1610 nm. This is a HR filter based on the multi-layer structure of FIG. 4 having 5 pairs of $SiO_2$/Si with phase shift that meets the design goal with reflectivity characteristics as shown in FIG. 3. Of course, one of ordinary skill in the art would recognize many variations, alternatives, and modifications in the number of multiple pairs of layers, choice of first layer/second layer materials, method of formation for each layer, phase shift imposed in a selected one pair of the multiple pairs of layers, and a reference wavelength selected to be as small as possible.

Figure 9:
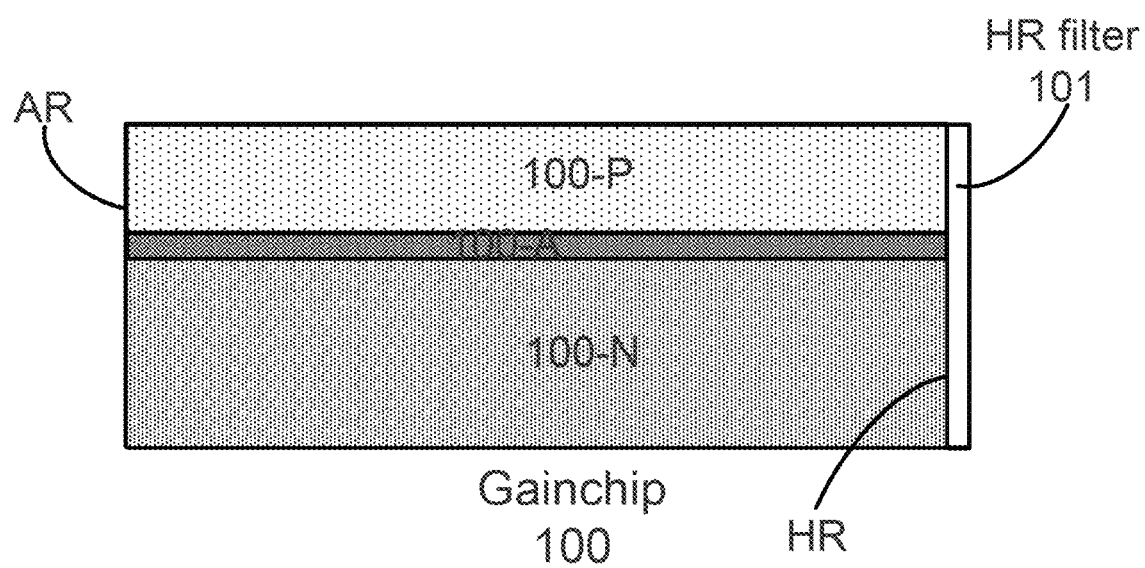
FIG. 9 is a schematic diagram of a gain chip of a tunable laser having the thin-film filter formed on a high-reflectivity facet thereof designed for suppressing side-mode lasing according to an embodiment of the present invention.

In another aspect, the present disclosure also provides a gain chip for wavelength tunable semiconductor laser. As described above, the thin-film filter provided in the present disclosure is applied to a High-reflectivity facet of a gain chip employed for a wavelength tunable laser module, though other applications are possible. FIG. 9 shows a schematic diagram of a gain chip of a tunable laser having the thin-film filter formed on a high-reflectivity facet thereof designed for suppressing side-mode lasing according to an embodiment of the present invention. This diagram is merely an example, which should not unduly limit the scope of the claims. One of ordinary skill in the art would recognize many variations, alternatives, and modifications. As shown, the gain chip 100 is provided as a diode structure based on InP material with an active region 100-A sandwiched by a p-type region 100-P and a n-type region 100-N formed along a length direction and terminated with two end facets. One end facet is configured to be an anti-reflection (AR) facet while another end facet is configured to be a high-reflectivity (HR) facet. With the AR facet and HR facet, the gain chip 100 is configured to be a lasing cavity and the active region 100-A is driven by a bias current applied across the p-type region 100-P and the n-type region 100-N to emit light which is further excited and amplified within the lasing cavity to form a laser light. The laser light reflected every time from the HR facet due to a HR filter 101 attached at the HR facet which is typically configured with high-reflectivity (>90%) characteristics.

In this disclosure, the gain chip 100 is applied in a reflective semiconductor optical amplifier (RSOA) of a tunable laser module based on Vernier tuner having at least two ring resonators formed in a silicon photonics substrate. The Vernier tuner is used to tune wavelength in a wide range based on a joint-free-spectral-range (JFSR) between a first wavelength and a second wavelength determined by proper design of the ring resonators. The lasing cavity is supposed to output the lasing emission primarily at the basic mode JFSR peak at the first wavelength while including lasing emission at the side mode JFSR peak at the second wavelength. A wavelength tunable range can be provided by at least a lower half of the JFSR starting from the first wavelength to a mid-point of the JFSR. As described in earlier sections of the specification, the HR filter 101 is reconfigured to provide a high (>90%) reflectivity for wavelengths in the wavelength tunable range while introduce a reflectivity dip (<50%) at a narrow range (about 25 nm) around the side mode JFSR peak at the second wavelength. The HR filter 101 is substantially characterized in FIG. 3 and is designed as a multi-layer structure 101 shown in FIG. 4. Several model filters are proposed and described in FIG. 6 and FIG. 7. A sample filter is fabricated to substantially match the design requirement has been shown in FIG. 8.

Figure 10:
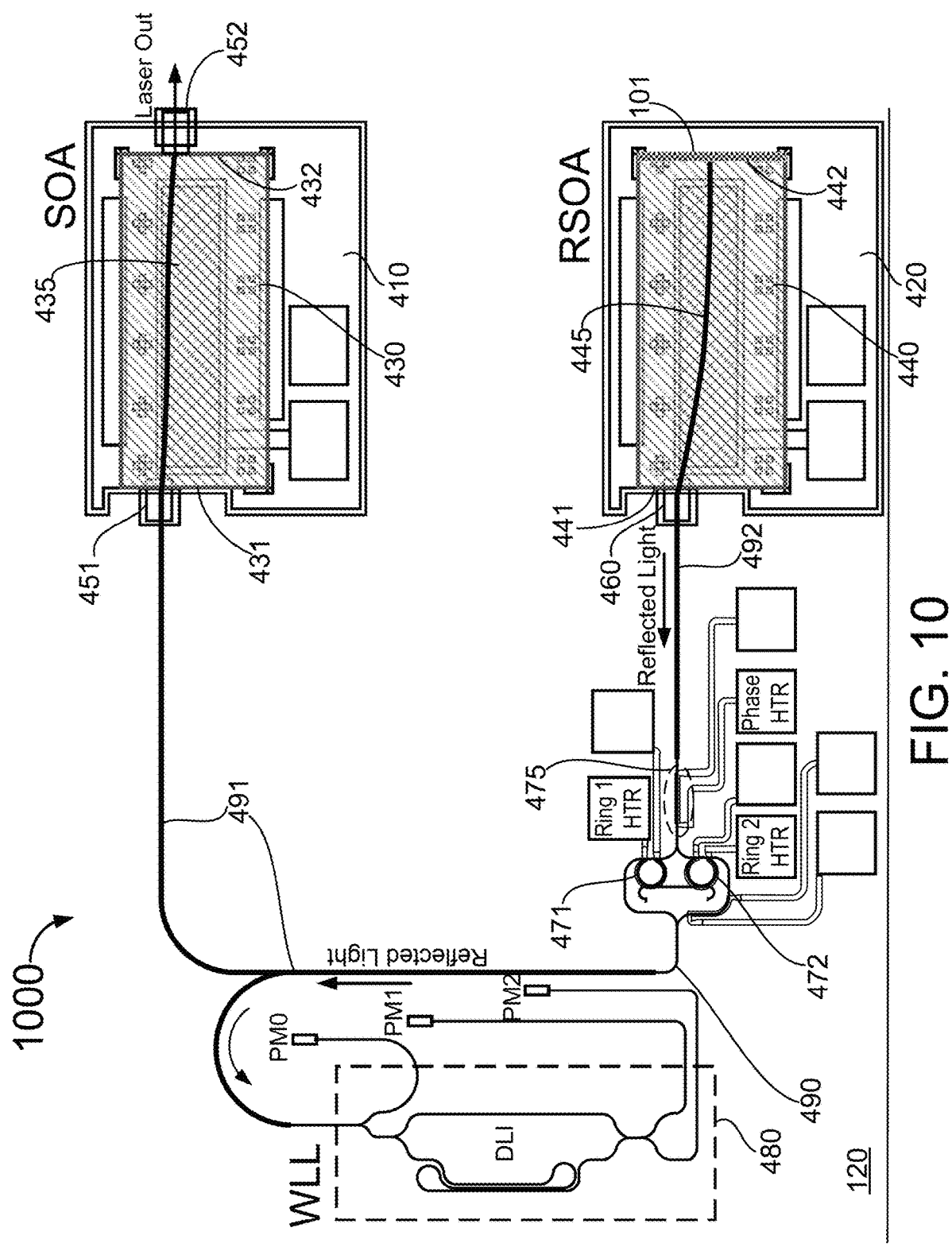
FIG. 10 is a diagram of a wavelength tunable semiconductor laser having the thin-film filter added to a high-reflectivity facet of a gain chip of a reflective semiconductor optical amplifier therein according to an embodiment of the present invention.

In yet another aspect, the present disclosure provides a silicon-photonics-based wide-band wavelength tunable semiconductor laser that includes a gain chip having a HR filter described herein. FIG. 10 is a diagram of a wavelength tunable semiconductor laser module having the thin-film filter added to a high-reflectivity facet of a gain chip of a reflective semiconductor optical amplifier therein according to an embodiment of the present invention. This diagram is merely an example, which should not unduly limit the scope of the claims. One of ordinary skill in the art would recognize many variations, alternatives, and modifications. As shown, the tunable laser module 1000 includes a first laser diode chip 430 bonded onto a first chip site 410 of a silicon photonics substrate 120, a second laser diode chip 440 bonded onto a second chip site 420 of the silicon photonics substrate 120, a tunable filter, i.e., a Vernier tuner, includes two ring resonators 471 and 472 and a phase matcher 475, which on the one end is coupled to a first gain region 435 of the first laser diode chip 430 via a first waveguide 491 connected to a first integrated coupler 451. The tunable filter on the other end is coupled to the second gain region 445 of the second laser diode chip 440 via a second waveguide 492 connected to a second integrated coupler 460. The second gain region 445 of the second laser diode chip 440 is configured with a lasing cavity between an anti-reflection (AR) facet 441 and a high-reflectivity (HR) facet 442 and served as a reflective semiconductor optical amplifier (RSOA). A laser light can be generated in the lasing cavity of the second gain region 445. The laser light is reflected from the HR facet 442 and amplified before emitting out of the AR facet 441 via the second integrated coupler 460 as a reflected light to the tunable filter. Optionally, the tunable laser module 1000 includes a wavelength locker (WLL) 480 coupled to the tunable filer via a waveguide 490 and coupled to the first gain chip 435 via a first waveguide 491. The wavelength locker 480 is configured to use a waveguide-based delay-line interferometer to lock the wavelength of the reflected light from the tunable filter. The reflected light with a wavelength tuned by the Vernier tuner and locked by the wavelength locker 480 is guided into the first gain region 435 of the first laser diode chip 430 via the first integrated coupler 451. The first gain region is configured with a lasing cavity between two anti-reflection (AR) facets 431 and 432 and served as a semiconductor optical amplifier (SOA) to amplify a laser light therein. As the reflected light is guided into the first gain region 435, it is amplified therein before outputting via a third integrated coupler 452 to a waveguide in the silicon photonics substrate 120.

Referring to FIG. 10, the tunable filter of the tunable laser 1000 further includes a first heater (Ring1_HTR) having a resistive thin-film overlying the first ring resonator 471, a second heater (Ring2_HTR) having a resistive thin-film overlying the second ring resonator 472, a third heater (Phase_HTR) having a resistive thin-film overlying a phase matcher 475 that is connected with the second waveguide 492. These heaters are configured to change temperature to cause a change of transmission spectrum of the light passing through respective ring resonators. Each transmission spectrum of the ring resonator has multiple resonate peaks (see FIG. 2). In an embodiment, the two ring resonators, 471 and 472, are provided with slightly different radii, then an offset between the two transmission spectra exists when they are superimposed (see FIG. 2). The first heater and the second heater can be controllably change temperatures of the respective first ring resonator and the second ring resonator to cause respective resonate peaks to shift to provide an extended tunable range of the wavelengths of those resonate peaks. After the initial excited light passing through the tunable filter is reflected back by the HR facet 442 of the second gain region 445, a joint reflectivity spectrum gives a strong central peak (see the basic mode JFSR peak in FIG. 2), which can be fine tuned by changing temperature of the phase matcher 475 using the third heater. While, the joint reflectivity spectrum also introduces a second peak at a larger wavelength (distanced by a joint-free-spectral-range or JFSR), which is a side mode JFSR peak in FIG. 2 and could be also amplified to lase out if the reflectivity curve of a thin-film filter 101 attached to the HR facet 442 is flat over all the wavelengths.

In order to obtain a single wavelength lasing out of the tunable laser module, the reflectivity curve can be improved with a long wavelength reflectivity dip. Based on the thin-film filter 101 provided in this disclosure and described in earlier sections of the specification, the reflectivity curve of the HR facet 442 is altered to provide high reflectivity of at least 90% over the nominal tunable range starting from the basic mode JFSR peak to a mid-point of the JFSR (e.g., 1526 nm to 1568 nm) of the tunable laser module 1000 but provide a high-contrast reflectivity dip of at least less than 50% at a narrow range around the side mode JFSR peak (e.g., 25 nm range around 1610 nm). Thus, the side mode lasing by the tunable laser module 1000 is substantially suppressed.

The wavelength tunable semiconductor laser described herein can be applied into an integrated coherent optical transceiver based on the silicon photonics platform. Details of the coherent optical transceiver chip and other applications of the wavelength tunable semiconductor laser can be found in patent application Ser. No. 16/357,095, filed Mar. 18, 2019, commonly assigned to Inphi Corp. of Santa Clara, Calif. Depending on applications, the integrated coherent transceiver package can be configured with a compact form factor that adapts with any system design for coherent optical communication.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A wavelength tunable semiconductor laser comprising:
   a wavelength tunable optical filter formed in a silicon photonics substrate and configured to yield a joint free-spectral-range between a first wavelength and a second wavelength;
   a phase matcher comprising a waveguide formed in the silicon photonics substrate and coupled to the wavelength tunable optical filter;
   a gain chip comprising a lasing cavity having an active region disposed between a high-reflectivity facet and an anti-reflection facet having an exit port coupled to the waveguide of the phase matcher, the lasing cavity being configured to generate a laser light in the active region and to emit the laser light out the exit port; and
   a thin film filter disposed on an outer side of the high-reflectivity facet, the thin film filter formed of a stack of multiple pairs of filter layers, the multiple pairs of filter layers comprising a plurality of first filter layers comprising a first material alternating with a plurality of second filter layers comprising a second material, each of the multiple pairs of filter layers containing one of the first filter layers overlying one of the second filter layers, the first filter layers having a first thickness and a first optical thickness, each of the plurality of second filter layers having a second thickness different from the first thickness and a second optical thickness equal to the first optical thickness, and at least one of the first filter layers in one of the multiple pairs having a third thickness greater than the first thickness and a third optical thickness that is greater than the first optical thickness.

2. The wavelength tunable semiconductor laser of claim 1 wherein the first filter layer in each pair of filter layers is more distal to the outer side of the high-reflectivity facet than the second filter layer in the same pair of filter layers.

3. The wavelength tunable semiconductor laser of claim 1 wherein each first filter layer of the alternating pairs of filter layers comprises a high-refractive index material and each second layer of the alternating pairs of filter layers comprises a low-refractive index material having a refractive index that is lower than the high-refractive index material.

4. The wavelength tunable semiconductor laser of claim 1 wherein the wavelength tunable optical filter comprises at least two ring resonators formed as respective ring-shaped waveguides in the silicon photonics substrate, each ring-shaped waveguide having different radius.

5. The wavelength tunable semiconductor laser of claim 4 wherein the wavelength tunable optical filter further comprises resistive thin-film heaters overlying respective ones of at least two ring resonators to provide wavelength tuning of the laser light up to a tunable range in an extended C-band from the first wavelength at 1526 nm to a mid-point of the joint-free-spectral-range at 1568 nm.

6. A wavelength tunable semiconductor laser, comprising:
   a wavelength tunable optical filter formed in a silicon photonics substrate and configured to yield a joint free-spectral-range between a first wavelength and a second wavelength;
   a phase matcher comprising a waveguide formed in the silicon photonics substrate and coupled to the wavelength tunable optical filter;
   a gain chip comprising a lasing cavity having an active region disposed between a high-reflectivity facet and an anti-reflection facet having an exit port coupled to the waveguide of the phase matcher, the lasing cavity being configured to generate a laser light in the active region and to emit the laser light out the exit port;
   a thin film filter disposed on an outer side of the high-reflectivity facet, the thin film filter formed of a stack of alternating pairs of filter layers, each respective pair of filter layers containing a first filter layer overlying a second filter layer, among which a plurality of first filter layers have a first optical thickness, a plurality of second filter layers having a second optical thickness equal to the first optical thickness, and at least one first filter layer having a third optical thickness that is greater than the first optical thickness; and
   a wavelength locker coupled to the wavelength tunable optical filter and a semiconductor optical amplifier having a second gain chip configured to amplify the laser light with a single wavelength tuned by the wavelength tunable optical filter and locked by the wavelength locker before outputting the laser light with the single wavelength substantially free from the second wavelength.

7. A wavelength tunable semiconductor laser, comprising:
   a wavelength tunable optical filter formed in a silicon photonics substrate and configured to yield a joint free-spectral-range between a first wavelength and a second wavelength;
   a phase matcher comprising a waveguide formed in the silicon photonics substrate and coupled to the wavelength tunable optical filter;
   a gain chip comprising a lasing cavity having an active region disposed between a high-reflectivity facet and an anti-reflection facet having an exit port coupled to the waveguide of the phase matcher, the lasing cavity being configured to generate a laser light in the active region and to emit the laser light out the exit port; and
   a thin film filter disposed on an outer side of the high-reflectivity facet, the thin film filter formed of a stack of alternating pairs of filter layers, each respective pair of filter layers containing a first filter layer overlying a second filter layer, among which a plurality of first filter layers have a first optical thickness, a plurality of second filter layers having a second optical thickness equal to the first optical thickness, and at least one first filter layer having a third optical thickness that is greater than the first optical thickness, wherein the thin film filter is configured to provide at least 90% inner reflectivity for the laser light from the high-reflectivity facet at any wavelength within a spectral range between the first wavelength to a mid-point of a joint-free-spectral-range and less than 50% inner reflectivity for any wavelength within a 25 nm band surrounding the second wavelength.

8. A wavelength tunable semiconductor laser, comprising:
a wavelength tunable optical filter formed in a silicon photonics substrate and configured to yield a joint free-spectral-range between a first wavelength and a second wavelength;
a phase matcher comprising a waveguide formed in the silicon photonics substrate and coupled to the wavelength tunable optical filter;
a gain chip comprising a lasing cavity having an active region disposed between a high-reflectivity facet and an anti-reflection facet having an exit port coupled to the waveguide of the phase matcher, the lasing cavity being configured to generate a laser light in the active region and to emit the laser light out the exit port; and
a thin film filter disposed on an outer side of the high-reflectivity facet, the thin film filter formed of a stack of alternating pairs of filter layers, each respective pair of filter layers containing a first filter layer overlying a second filter layer, among which a plurality of first filter layers have a first optical thickness, a plurality of second filter layers having a second optical thickness equal to the first optical thickness, and at least one first filter layer having a third optical thickness that is greater than the first optical thickness,
wherein the active region of the gain chip is configured as a linear waveguide and comprises an indium phosphide PN junction disposed in the linear waveguide.

9. A wavelength tunable semiconductor laser, comprising:
a wavelength tunable optical filter formed in a silicon photonics substrate and configured to yield a joint free-spectral-range between a first wavelength and a second wavelength;
a phase matcher comprising a waveguide formed in the silicon photonics substrate and coupled to the wavelength tunable optical filter;
a gain chip comprising a lasing cavity having an active region disposed between a high-reflectivity facet and an anti-reflection facet having an exit port coupled to the waveguide of the phase matcher, the lasing cavity being configured to generate a laser light in the active region and to emit the laser light out the exit port; and
a thin film filter disposed on an outer side of the high-reflectivity facet, the thin film filter formed of a stack of alternating pairs of filter layers, each respective pair of filter layers containing a first filter layer overlying a second filter layer, among which a plurality of first filter layers have a first optical thickness, a plurality of second filter layers having a second optical thickness equal to the first optical thickness, and at least one first filter layer having a third optical thickness that is greater than the first optical thickness,
wherein each first filter layer of the alternating pairs of filter layers comprises a high-refractive index material and each second layer of the alternating pairs of filter layers comprises a low-refractive index material having a refractive index that is lower than the high-refractive index material, and
wherein the high-refractive index material is one selected from a Si layer, and the low-refractive index material is one selected from a $SiO_2$ layer and a $Al_2O_3$ layer.

10. A wavelength tunable semiconductor laser, comprising:
a wavelength tunable optical filter formed in a silicon photonics substrate and configured to yield a joint free-spectral-range between a first wavelength and a second wavelength;
a phase matcher comprising a waveguide formed in the silicon photonics substrate and coupled to the wavelength tunable optical filter;
a gain chip comprising a lasing cavity having an active region disposed between a high-reflectivity facet and an anti-reflection facet having an exit port coupled to the waveguide of the phase matcher, the lasing cavity being configured to generate a laser light in the active region and to emit the laser light out the exit port; and
a thin film filter disposed on an outer side of the high-reflectivity facet, the thin film filter formed of a stack of alternating pairs of filter layers, each respective pair of filter layers containing a first filter layer overlying a second filter layer, among which a plurality of first filter layers have a first optical thickness, a plurality of second filter layers having a second optical thickness equal to the first optical thickness, and at least one first filter layer having a third optical thickness that is greater than the first optical thickness,
wherein each first filter layer of the alternating pairs of filter layers comprises a high-refractive index material and each second layer of the alternating pairs of filter layers comprises a low-refractive index material having a refractive index that is lower than the high-refractive index material, and
wherein each second filter layer among the stack of alternating pairs of layers and all but a single first filter layer have respective optical thickness substantially equal to a quarter of a predetermined reference wavelength.

11. The wavelength tunable semiconductor laser of claim 10 wherein the reference wavelength is selected from wavelengths that are substantially smaller than the second wavelength.

12. The wavelength tunable semiconductor laser of claim 11 wherein the stack of alternating pairs of filter layers comprise a total physical thickness of less than 2 µm.

13. The wavelength tunable semiconductor laser of claim 10 wherein the stack of alternating pairs of layers comprise at least 5 pairs of layers including one pair containing the first layer having the third optical thickness that is greater than the quarter of the reference wavelength.

14. The wavelength tunable semiconductor laser of claim 13 wherein the one pair of filter layers containing the first filter layer having the third optical thickness that is greater than the second optical thickness is disposed in a middle position among the at least 5 pairs of layers, wherein the first layer having the third optical thickness provides an additional phase shift that increases a reflectivity loss for the laser light emitted from the high-reflectivity facet at the second wavelength.

* * * * *